US009065006B2

(12) United States Patent
Greiff et al.

(10) Patent No.: US 9,065,006 B2
(45) Date of Patent: Jun. 23, 2015

(54) LATERAL PHOTOVOLTAIC DEVICE FOR NEAR FIELD USE

(75) Inventors: Paul Greiff, Wayland, MA (US); Jose M Borrega, Boston, MA (US)

(73) Assignee: MTPV Power Corporation, Austin, TX (US)

(*) Notice: Subject to any disclaimer, the term of this patent is extended or adjusted under 35 U.S.C. 154(b) by 201 days.

(21) Appl. No.: 13/469,842

(22) Filed: May 11, 2012

(65) Prior Publication Data

US 2013/0298963 A1 Nov. 14, 2013

(51) Int. Cl.
*H01L 31/042* (2014.01)
*H02S 10/30* (2014.01)
*H01L 31/18* (2006.01)
*H01L 31/068* (2012.01)
*H01L 31/046* (2014.01)
*H01L 31/0465* (2014.01)
*H01L 31/056* (2014.01)

(52) U.S. Cl.
CPC .......... *H01L 31/1808* (2013.01); *H01L 31/068* (2013.01); *Y02E 10/52* (2013.01); *Y02E 10/547* (2013.01); *H01L 31/046* (2014.12); *H01L 31/0465* (2014.12); *H02S 10/30* (2014.12); *H01L 31/056* (2014.12)

(58) Field of Classification Search
CPC .............................. H01L 31/042; H02S 10/30
USPC .......... 136/206, 207, 239, 244, 252, 253, 261
See application file for complete search history.

(56) References Cited

U.S. PATENT DOCUMENTS

| 3,325,703 | A * | 6/1967 | Rutz ............................. 257/105 |
| 4,612,408 | A * | 9/1986 | Moddel et al. ................ 136/244 |
| 6,441,297 | B1 * | 8/2002 | Keller et al. .................. 136/249 |
| 2004/0261840 | A1 * | 12/2004 | Schmit et al. ................. 136/258 |
| 2009/0101206 | A1 * | 4/2009 | Diklich ........................ 136/257 |
| 2011/0067752 | A1 * | 3/2011 | Fafard .......................... 136/255 |

* cited by examiner

*Primary Examiner* — Susan D Leong
(74) *Attorney, Agent, or Firm* — Taylor Russell & Russell, P.C.

(57) ABSTRACT

A device, method and process of fabricating an interdigitated multicell thermo-photo-voltaic component that is particularly efficient for generating electrical energy from photons in the red and near-infrared spectrum received from a heat source in the near field. Where the absorbing region is germanium, the device is capable of generating electrical energy by absorbing photon energy in the greater than 0.67 electron volt range corresponding to radiation in the infrared and near-infrared spectrum. Use of germanium semiconductor material provides a good match for converting energy from a low temperature heat source. The side that is opposite the photon receiving side of the device includes metal interconnections and dielectric material which provide an excellent back surface reflector for recycling below band photons back to the emitter. Multiple cells may be fabricated and interconnected as a monolithic large scale array for improved performance.

17 Claims, 7 Drawing Sheets

FIGURE 5B (VIEW A-A')
FIGURE 5C (VIEW B-B')
FIGURE 5D

LATERAL PHOTOVOLTAIC DEVICE FOR NEAR FIELD USE

BACKGROUND

The present invention relates generally to thermophotovoltaic devices for generating electrical energy, and more particularly to the process of fabricating an interdigitated multicell device that is particularly efficient for generating electrical energy from a heat source by operation in the near field. In this and similar applications, a very high efficiency device is required that absorbs more in band than out of band photons. Inefficient thermophotovoltaic cells cause a drop in the temperature of the emitter used to form near fields and this results in a poorer photon transmission to the thermophotovoltaic cell.

Photovoltaic energy conversion is a direct conversion process that transfers electromagnetic energy in the form of photons from an emitter to a photovoltaic device for generation of electrical energy by the receiving photovoltaic device. The most widely recognized photovoltaic devices are based on semiconductor technology and optimized for operation in the solar spectrum, i.e. light from the sun, while less well-known semiconductor photovoltaic devices that are optimized for operation in the infrared and near-infrared spectrum are referred to as thermophotovoltaic devices. For operation in the solar spectrum, photovoltaic devices generate electrical energy by absorbing photons of energy in the 1.0 to 5.0 electron volt range. Thermophotovoltaic devices generate electrical energy by additionally absorbing lower energy photons in the 0.2-1.0 electron volt range. To provide the best match for a thermophotovoltaic device and the incoming spectrum of photon energy from a low temperature heat source requires a narrow bandgap of the semiconductor material of the thermophotovoltaic device. Photons having energy greater than or equal to the semiconductor material bandgap can generate electrical energy, while lower energy photons generate heat and result in a loss of efficiency. In addition, photon energy well in excess of the semiconductor material bandgap is also partially lost as heat.

Thermophotovoltaic devices comprise one or more semiconductor P-N junctions or diodes that collect and separate the electron/hole pairs that are generated by the absorbtion of photon energy and thereby produce electrical energy. The characteristics of a thermophotovoltaic device within a thermophotovoltaic system provide opportunities for optimizing the operation of that system through use of additional components such as concentrators, filters, reflectors and selective emitters. Multiple thermophotovoltaic devices may also be fabricated on a single substrate for large array applications.

Thermophotovoltaic devices receive photon energy from a relatively hot emitter separated from a relatively cool receiving thermophotovoltaic device by a gap. When the gap spacing between an emitter and receiver is one micron or less, which is considered to be near field operation, greater power transfer is achieved than that predicted by Planck's Law for black body radiation for far field operation. For gap spacing of one-tenth micron, energy transfer increases by factors of five or more are possible when compared with that predicted by far field theory. However, such narrow gap spacing generally requires a vacuum in a gap between a relatively hot emitter and a relatively cool thermophotovoltaic device to reduce the effects of heat conduction. Although increases in energy transfer between an emitter and a thermophotovoltaic device receiver may be achieved by increasing the temperature of the emitter, material limitations place a practical limit on a maximum temperature of operation of these devices. Also, at higher device temperatures, intrinsic carrier generation within the semiconductor device prevents effective collection of electrons.

Although in theory any material that can support the temperature can be used as an emitter, certain advantages, such as a more favorable output spectrum, may pertain to selective materials. Although not limited to these examples, materials used for, emitters in thermophotovoltaic systems include: single crystal silicon, polycrystalline silicon, silicon carbide, tungsten, rare-earth oxides and photonic crystals. Thermophotovoltaic devices may be fabricated from materials such as silicon, germanium, gallium antimonide, indium gallium arsenide antimonide, indium gallium arsenide, and indium phosphide arsenide antimonide.

Previous fabrication methods for producing thermophotovoltaic devices have employed thin active layers comprising multiple narrow cells on a window-like substrate. These isolated cells are interconnected in series for producing a higher voltage at lower output current levels in order to minimize power loss. Increased production costs result from the additional complexity of fabricating multiple cells on a common substrate.

These previous devices also employ a collection method where electron-hole pairs created from incoming photons travel perpendicular to the plane of the device to reach their respective collecting regions. For purposes of distinction, we shall call this situation perpendicular collection. Perpendicular collection methods are often the only option that can be employed in prior multicell devices because many of the low bandgap materials require junction formation by epitaxy, as the common methods of diffusion and ion implantation have not proved successful to date. If epitaxy alone is used, this inherently gives a perpendicular construction. A low bandgap material is required to collect predominantly low energy infrared and near-infrared photons emitted from relatively low temperature sources.

A perpendicular collection method also requires a lateral conduction layer (LCL) for conduction of photocurrents from one cell to the next cell of a multicell device. The use of perpendicular collection layer methods and lateral conduction layers requires trade-offs. A thick, heavily doped layer is desirable to minimize resistive losses in the lateral conduction layer but a lightly doped region is desired to minimize absorption of below-band photons, which can only be converted into heat.

The prior art photovoltaic devices have been designed for far field operation and have focused on obtaining the maximum output from the impinging spectrum to obtain an attractive overall system cost. The influence of near field operation is now illustrated for the case where germanium is used as the collecting semiconductor material. The maximum output consideration requires a thick germanium layer of at least 150 microns. However, such a thick layer also creates severe problems in forming a multicell device which requires physical isolation between the unit cells making up the device.

Another factor promoting thick absorbing layers of germanium in prior devices is the fact that germanium has two band gaps; a direct bandgap at 0.80 eV and an indirect gap at 0.67 eV. Indirect gaps have smaller absorption coefficients so that if one is trying to maximize photon collection for both gaps a thick absorption layer is required.

Some of the prior art multicell structures also have unresolved issues such as ohmic contact caused by the doping concentration compromise required in the LCL. Minimizing contact resistance for these devices requires elaborate and complex processes, such as tunnel junctions, which make these cells less competitive cost wise for an energy conversion system.

The epitaxial only construction of prior art devices results in the uppermost region being uniformly heavily doped across the entire face of the device in order to make good ohmic contact where contacted by metallization. This gives an excessive area of heavy doping which results in high below band absorption in this layer similar to the case with the LCL.

The distinction "epitaxial only" is used because when all of the regions are formed by epitaxy the collection configuration must be perpendicular. If at least one of the regions can be formed by diffusion or ion implant then a lateral collection construction may be possible if the diffusion length allows for reasonable geometries. Again, for distinction, we define a lateral collection method as one where the minority carrier flow to the collecting regions is parallel to the plane of the photovoltaic device.

Also, the heavily doped upper layer interferes with the ability to make a high efficiency back surface reflector because heavily doped regions do not make the best reflectors. An efficient back surface reflector is a very important component in an efficient near field energy conversion system.

SUMMARY

The disclosed invention is a device, method and process of fabricating the device, the device being an interdigitated multicell thermophotovoltaic component that is particularly efficient for generating electrical energy from photons in the red and near-infrared spectrum received from a heat source in the near field. For the embodiment where the absorbing region is germanium, the device is capable of generating electrical energy by absorbing photon energy in the greater than 0.67 electron volt range corresponding to radiation in the infrared and near-infrared spectrum. Use of germanium semiconductor material, which has bandgaps of 0.67 and 0.80 electron volts, provides a good match for converting energy from a low temperature heat source. The side that is opposite the photon receiving side of the device includes metal interconnections and dielectric material which provide an excellent back surface reflector for recycling below band photons back to the emitter. The device is designed to receive photon energy from a radiating emitter spaced less than a micron from its surface. Multiple cells may be fabricated and interconnected as a monolithic large scale array for improved performance.

Unlike prior devices that suffer from the limitations imposed by perpendicular collection methods and lateral conduction layers, the present device relies on a lateral collection method. The electron-hole pairs that are generated travel laterally between N+ collection junctions and P+ ohmic contacts that are disposed side by side on the surface of the collecting material. In the case of germanium, only a single layer of lightly doped P-type material about ten microns thick is required for collection. The N+ and P+ regions may be formed by conventional diffusion or ion implantation. For germanium the heavily doped regions can be minimized in area because the high lifetime allows for wide separation of the ohmic contacts. Isolation cuts do not require additional openings in the bottom of the trench to form metallization contact to an LCL and are therefore simpler to fabricate than in the perpendicular case. In forming the collection region which is adjacent to the undoped substrate, a thin initial layer of medium concentration is used to create a reflecting layer for minority carriers. This effectively isolates the collecting region from the substrate heterojunction which can be heavily damaged due to lattice mismatch.

The lateral collection method can only be employed with reasonably high lifetime or long diffusion length materials. The advantages of the described invention include high efficiency of in band to below band absorption. Because the un-doped substrate, which may be gallium arsenide in the germanium embodiment, is a wide band gap material, it does not absorb the photons which are in band for the collecting region. The diffusion length in moderately doped germanium is much longer than the junction spacing, so the horizontal collection method remains very efficient when this material is used. Also, the below band photon absorption is minimized by the un-doped nature of the substrate. The doped portions of the collecting region are made very thin so that below band photon absorption is minimized in these areas. Another advantage of the present approach is that a thin collecting layer is a very cost-effective method of fabricating the device. Full thickness substrates of collecting materials such as germanium and gallium antimonide are generally very expensive. Germanium on Gallium Arsenide can be grown on large substrates using inexpensive vapor deposition methods as opposed to Molecular Beam Epitaxy (MBE) or Meal Organic Chemical Vapor Deposition (MOCVD) which are commonly used for many of the epitaxy only infrared sensors. Since there is no lateral conduction layer, isolation trenches may be made narrow and refilled to facilitate metallization. There is no absorption that would otherwise take place in a lateral conduction layer, thus minimizing below band absorption.

The invention uses a thin layer of collecting material that is approximately 10 microns thick that, in the case of germanium, provides only a minimal cross section for below band or free carrier absorption. It takes advantage of a nonlinear variation in the absorption coefficient versus wavelength that makes the magnitude of collection from a low temperature source practical when combined with near field enhancement. Although some loss of response may occur due to the thin layer of germanium, operation in the near field multiplies the photocurrent so that an attractive power density results that is about an order of magnitude greater than typical solar cells.

An embodiment of the present invention is a multicell thermophotovoltaic device for generating electrical energy, which comprises: an undoped substrate common to all cells of the multicell thermophotovoltaic device, the substrate having a first surface for receiving infrared and near-infrared photon energy from an emitter heat source in a near field and a second surface opposite the first surface forming an interface with a plurality of thin collection region layers; where the plurality of thin collection region layers for generating electron-hole pairs from absorbed photon energy from the substrate; N+ collection junctions and P+ ohmic contact regions formed in a surface of each of the plurality of thin collection region layers opposite the substrate, the N+ collection junctions for collecting electrons and the P+ ohmic contact regions for collecting holes from the electron-hole pairs traveling laterally in the plurality of collection region layers; isolation cuts between individual cells of the multicell thermovoltaic device, the individual cells formed by isolating adjacent P+ ohmic contact regions and N+ collection junctions within each of the plurality of collection region layers; dielectric layers formed on the surface of each of the plurality of collection region layers opposite the substrate and on surfaces of the isolation cuts; and metal interconnections and vias in the dielectric material for interconnecting N+ collection junctions and P+ ohmic contact regions within and between individual cells in an array for forming the multicell thermophotovoltaic device.

Another embodiment of the present invention is a method for generating electrical energy using a multicell thermophotovoltaic device, which comprise the steps of: positioning a first surface of an undoped substrate common to all cells of the multicell thermophotovoltaic device for receiving infrared and near-infrared photon energy from an emitter heat source in a near field and forming an interface with a plurality of thin collection region layers on a second surface of the substrate opposite the first surface of the substrate; generating electron-hole pairs from absorbed photon energy from the substrate by the plurality of thin collection region layers; forming N+ collection junctions and P+ ohmic contact regions in a surface of each of the plurality of thin collection region layers opposite the substrate, the N+ collection junctions for collecting electrons and the P+ ohmic contact regions for collecting holes from the electron-hole pairs traveling laterally in the plurality of collection region layers; providing isolation cuts between individual cells of the multicell thermovoltaic device, the individual cells formed by isolating adjacent P+ ohmic contact regions and N+ collection junctions within each of the plurality of collection region layers; forming dielectric layers on the surface of each of the plurality of collection region layers opposite the substrate and on surfaces of the isolation cuts; and interconnecting N+ collection junctions and P+ ohmic contact regions using metal interconnections and vias in the dielectric material within and between individual cells in an array for forming the multicell thermophotovoltaic device.

Yet another embodiment of the present invention is process for fabricating a multicell thermophotovoltaic device which comprises the steps of: epitaxially growing a thin layer of lightly doped P-type germanium on a substrate of undoped gallium arsenide; forming P+ regions and N+ regions in the lightly doped P-type germanium layer opposite the substrate by ion implantation; providing a lateral collection region in the lightly doped P-type germanium layer between the P+ region and the N+ region for electron-hole pair generation by absorbed incident photons; etching isolation cuts through the P-type germanium layer down to the substrate for isolating diodes formed by the P+ region and N+ region and the P-type germanium layer; depositing a dielectric layer over the surface comprising the P+ region, the N+ region, the P-type layer and the isolation cuts; forming vias to expose contact areas to the P+ regions and the N+ regions; and forming ohmic contacts by metallization patterns for interconnecting diodes and cells.

Note that reference to perpendicular and lateral collection regions used herein are for purposes of distinction with the prior art. The terms refer to the direction of flow of minority carriers from the point of generation to the respective ohmic contact collecting areas. Perpendicular motion is perpendicular to the plane of the device which is generally a flat substrate. Lateral motion is parallel to the plane of the substrate.

Note also that the terms N and P used throughout this description may be reversed if the opposite polarity semiconductor doping is used, i.e., N-type collector instead of the P-type collector illustrated.

In some cases, an ohmic contact may be formed by growth of an epitaxial layer which is subsequently etched in the form of the contacting region instead of a diffusion or implant. The complimentary ohmic contact may also be formed by a second epitaxial growth or preferably a diffusion or implant. The key distinction with prior art is that these regions are disposed laterally and not in a perpendicular fashion.

BRIEF DESCRIPTION OF THE DRAWINGS

These and other features, aspects and advantages of the present invention will become better understood with regard to the following description, appended claims, and accompanying drawings wherein:

FIG. 1 depicts a cross-section view of a single cell diode of a prior art device fabricated by growing epitaxial layers on a semi-insulating substrate and employing a perpendicular collection method;

FIG. 2 depicts a cross-section view of a multiple diode cell prior art device fabricated by growing epitaxial layers on a semi-insulating substrate and employing a perpendicular collection method, whereby the cells are electrically isolated from the substrate and interconnected on the common substrate to form a series connected diode string.

FIG. 3 depicts a cross section view of a single diode device fabricated by forming N+ collection junctions and P+ ohmic contact regions in a P-type collection layer and employing a lateral collection method;

FIG. 4 depicts a cross section view of a multiple diode cell device fabricated by forming N+ collection junctions and P+ ohmic contact regions in a P-type collection layer and employing a lateral collection method, whereby the cells are electrically isolated from the substrate and the individual cells are interconnected to form a series diode string.

FIG. 5 depicts an array of multiple diode cells formed by creating alternating interdigitated N+ collection junctions and P+ ohmic regions in a P-type collecting region and employing a lateral collection method according to the present invention, shown in a perspective view and in lateral and transverse directions; and FIG. 6 depicts steps of a fabrication process for forming a multicell device according to the present invention.

DETAILED DESCRIPTION OF THE DRAWINGS

Figure 1A:
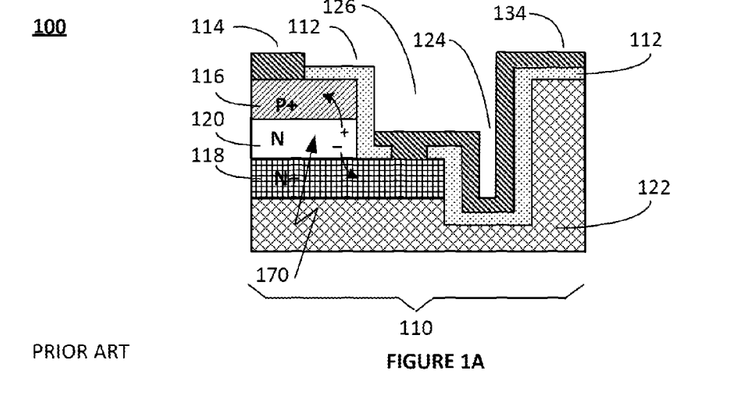
Figure 1B:
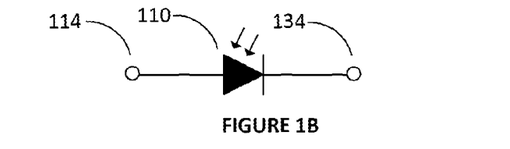

Turning to FIG. 1, FIG. 1A depicts a cross-section view 110 of a single diode prior art device 100 fabricated by growing epitaxial layers of P+ material 116, N+ material 118, and N-type material 120 on a semi-insulating substrate 122 and employing a perpendicular collection method. FIG. 1B depicts a symbolic electrical representation 110 of the device shown in FIG. 1A that comprises a single thermophotovoltaic diode. The semi-insulating substrate 122 is un-doped so that it acts as an insulator but has the requisite lattice spacing to support epitaxial growth processes. Alternate layers of an N+ region 118, N-region 120 and P+ region 116 are epitaxially grown on the substrate 122. Access to the N+ region 118 is obtained by etching a first cut 126 through the P+ region 116 and the N region 120 to the N+ region 118. To prevent unwanted electrical contact a dielectric layer 112 is deposited on the exposed surface of the cut. A second cut 124 down to the semi-insulating substrate 122 isolates N+ region 118. Ohmic contact regions to the diode are made by forming openings or vias in layer 112 to allow an anode ohmic contact 114 by a deposited metal film to the P+ region 116, and a an opening to allow a cathode ohmic contact 134 by a deposited metal film to the N+ region 118.

When photons 170 illuminate the N region 120, hole-electron pairs are generated in the N region 120 and the holes migrate to the P+ region 116 and the electrons migrate to the N+ region 118. This results in a thermophotovoltaic potential and current can flow externally between the anode ohmic contact 114 and the cathode ohmic contact 134. Note that the hole-electron migration is in a direction perpendicular to the plane of the device.

Figure 2A:
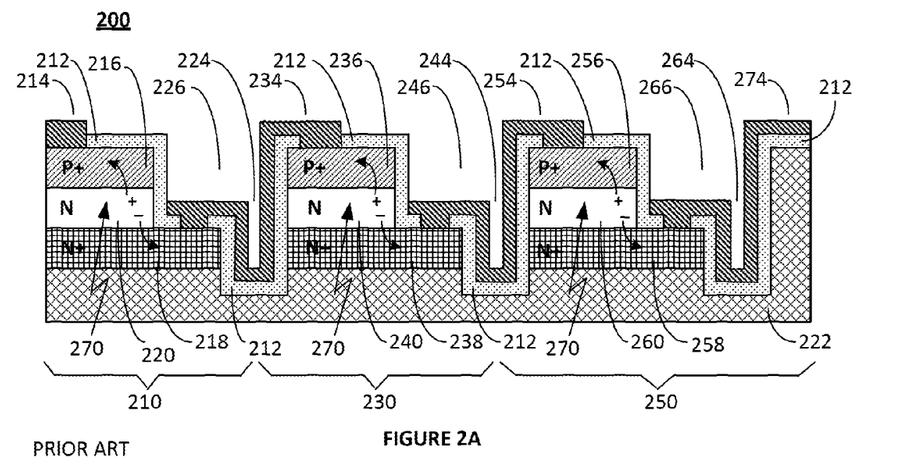
Figure 2B:
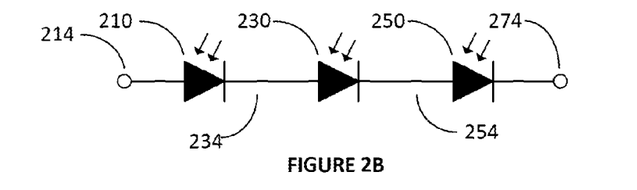

Turning to FIG. 2, FIG. 2 depicts a cross-section view of a multiple diode cells of prior art device 200 fabricated by growing diode layers of P+ material 216, 236, 256, N+ material 218, 238, 258 and N-type material 220, 240, 260 on a semi-insulating substrate 222 employing a perpendicular collection method. FIG. 2B depicts symbolic electrical representations 210, 230, 250 of the device shown in FIG. 2A. Note that FIG. 2A represents a series connection of diodes 210. 230, 250. The semi-insulating substrate 222 is doped so lightly that it acts as an insulator but has the requisite lattice spacing to support epitaxial growth. The N+ regions 218, 238 258 and the P+ regions 216, 236, 256 are isolated from each other by etching a first cut 226, 246, 266 through the P+ regions 216, 236, 256 and the N regions 220, 240, 260 to the N+ regions 218, 238, 258. A second cut 224, 244, 264 is etched down to the semi-insulating substrate 222 to isolate the diode cells. Isolation in the cuts is provided by dielectric layer 212 that has openings or vias to allow an anode ohmic contact by a deposited metal film 214 to the P+ regions 216, 236, and 256, and openings or vias 226, 246, and 266 to allow a cathode ohmic contact by the same deposited metal film. The resultant structure is a string of diode cells isolated from each other on the wafer and connected in a series string.

When photons 270 illuminate the N regions 220, 240, 260, hole-electron pairs are generated in the N regions 220, 240, 260 and the holes migrate to the P+ regions 216, 236, 256 and the electrons migrate to the N+ regions 218, 238, 258. This results in a thermophotovoltaic potential and current can flow externally between the anode ohmic contact 214 and the cathode ohmic contact 274 at opposite ends of the diode string. Note that the hole-electron migration is in a perpendicular direction.

Figure 3A:
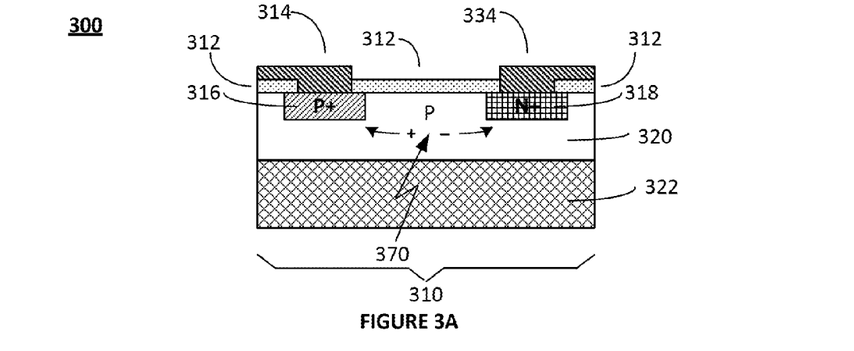
Figure 3B:
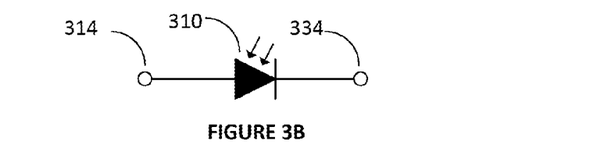

Turning to FIG. 3, FIG. 3A depicts a cross section view of a single diode device 300 fabricated by forming an N+ collection junction 318 and a P+ ohmic contact region 316 in a lightly doped P-type layer 320 and employing a lateral collection method. FIG. 3B depicts a symbolic electrical representation 310 of the device shown in FIG. 3A that comprises a single photovoltaic diode. Photon collection takes place in the lightly doped P-type layer 320 that has been grown on a substrate 322 of un-doped wide band gap material such as semi-insulating gallium arsenide or silicon. The collection layer 320 may be either N-type or P-type depending on the material selected and the other regions doped accordingly. The N+ region 318 and the P+ region 316 may be formed by any appropriate technique such as diffusion, ion implantation, or etching of a grown layer. The surface is protected by dielectric layer 312 that has openings or vias to allow an anode ohmic contact 314 by a deposited metal film to the P+ region 316, and a an opening to allow a cathode ohmic contact 334 by a deposited metal film to the N+ region 318. In many cases the metal layer is common to all contacts. Photon collection occurs in the P-type layer 320 which may be doped somewhat higher in the vicinity of the substrate 322 than the remainder of the P+ region 320 to form a diffusion barrier to keep minority carriers from migrating to the substrate 322 where they may be lost by recombination. When photons 370 illuminate the P-type layer 320, hole-electron pairs are generated in the P-type layer 320 and the holes migrate to the P+ region 316 and the electrons migrate to the N+ region 318. This results in a photovoltaic potential and current can flow externally between the anode ohmic contact 314 and the cathode ohmic contact 334. Note that the hole-electron migration is in a lateral direction. These configurations employ a thin layer 320 for photon collection.

Figure 4A:
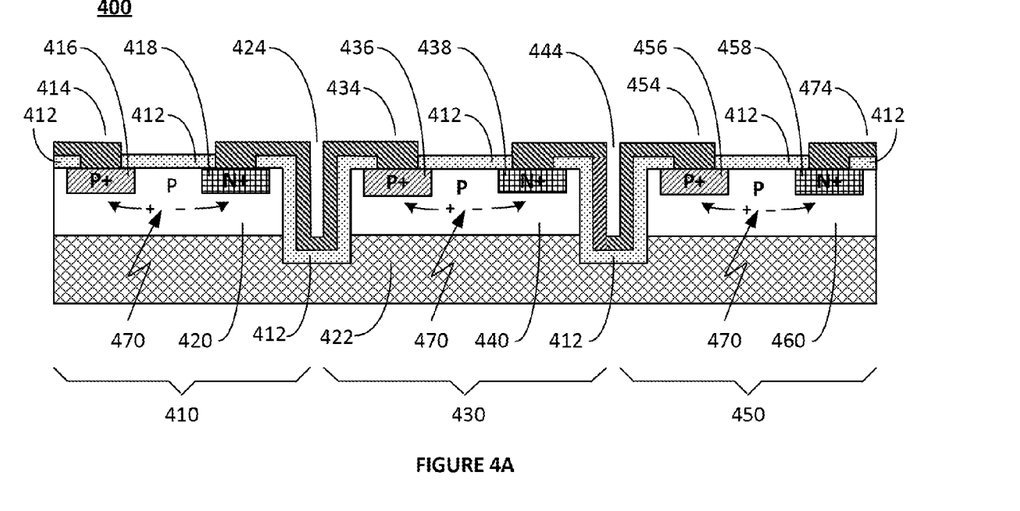
Figure 4B:
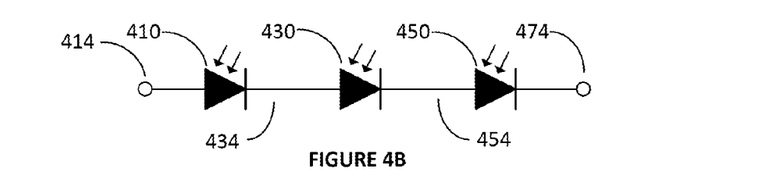

FIG. 4 depicts a cross section view of a multiple diode cell device 400 fabricated by forming alternate N+ collecting junctions 418, 438, 458 and P+ ohmic contact regions 416, 436, 456 to a lightly doped P-type absorbing layers 420, 440, 460 and employing a lateral collection method. FIG. 4B depicts symbolic electrical representations 410, 430, 450 of the device shown in FIG. 4A that comprises three series-connected thermo-photo-voltaic diodes 410, 430, 450. Within each cell 410, 430, 450 the diffusions alternate between N+ collection junctions 418, 438, 458 and P+ ohmic contact regions 416, 436, 456 to the P-type layers 420, 440, 460. The electron-hole pairs generated by photons absorbed by the P-type regions travel laterally to these N+ and P+ regions. Photon absorption takes place in the thin lightly doped P-type layers 420, 440, 460 that have been grown on a substrate 422 of un-doped wide band material such as semi-insulating gallium arsenide or silicon. The in band photon absorbing layers 420, 440, 460 may be N-type or P-type depending on the semiconductor material used.

The N+ regions 418, 438, 458 and the P+ regions 416, 4436, 456 may be formed by any appropriate technique and may be minimized in area because of the high lifetime in the absorbing layer. Surface protection and isolation on the cut surfaces is provided by dielectric layer 412 that has openings or vias to allow ohmic contact 414, 434, 454, 474 by a deposited metal film to the P+ region 416, 436, 456, and to the N+ region 418, 438, 458.

The current flows laterally between the ohmic contacts and the interconnecting metallization. Note there is no buried LCL used in this structure.

Photon absorption occurs in the P-type layers 420, 440, 460 which may be doped somewhat higher in the vicinity of the substrate 422 than the remainder of the P-regions 420, 440, 460 to form a diffusion barrier to keep minority carriers from migrating into the substrate 422 where they may be lost by recombination. When photons 470 illuminate the P-type layers 420, 440, 460, hole-electron pairs are generated in the P-type layer 420, 440, 460 and the holes migrate to the P+ regions 416, 436, 456 and the electrons migrate to the N+ region 418, 438, 458. The unit cells 410, 430, 450 are defined by isolation trenches or cuts 424, 444 that are etched into the substrate material between the first cell 410 and second cell 430, and the second cell 430 and the third cell 450. These trenches or cuts 424, 444 may be made narrow and refilled to present a smooth surface for ease of processing. Metallic interconnects 434, 454 are made within the cuts 424, 444 between the cathode 418 of the first cell 410 and the anode 436 of the second cell, and between the cathode 438 of the second cell 430 and the anode 456 of the third cell 450. When illuminated, this results in a photovoltaic potential between the anode ohmic contact 414 of the first cell 410 and the cathode ohmic contact 474 of the third cell 450, with the three cells being connected in series. Note that the hole-electron migration is in a lateral direction. These configurations employ a thin layer 420, 440, 460 for photon absorption.

The thermophotovoltaic array is configured to be illuminated in the near field through the lower surface of the substrate 422. This provides the capability of having a smooth flat surface that is ideal for forming a near-field gap with a photon-emitting surface. The dielectric or insulating layers 412 and the metallization are selected for optimal back surface reflection, and the area of doped regions are minimized so that the amount of reflection is maximized without degrading collection efficiency.

Figure 5A:
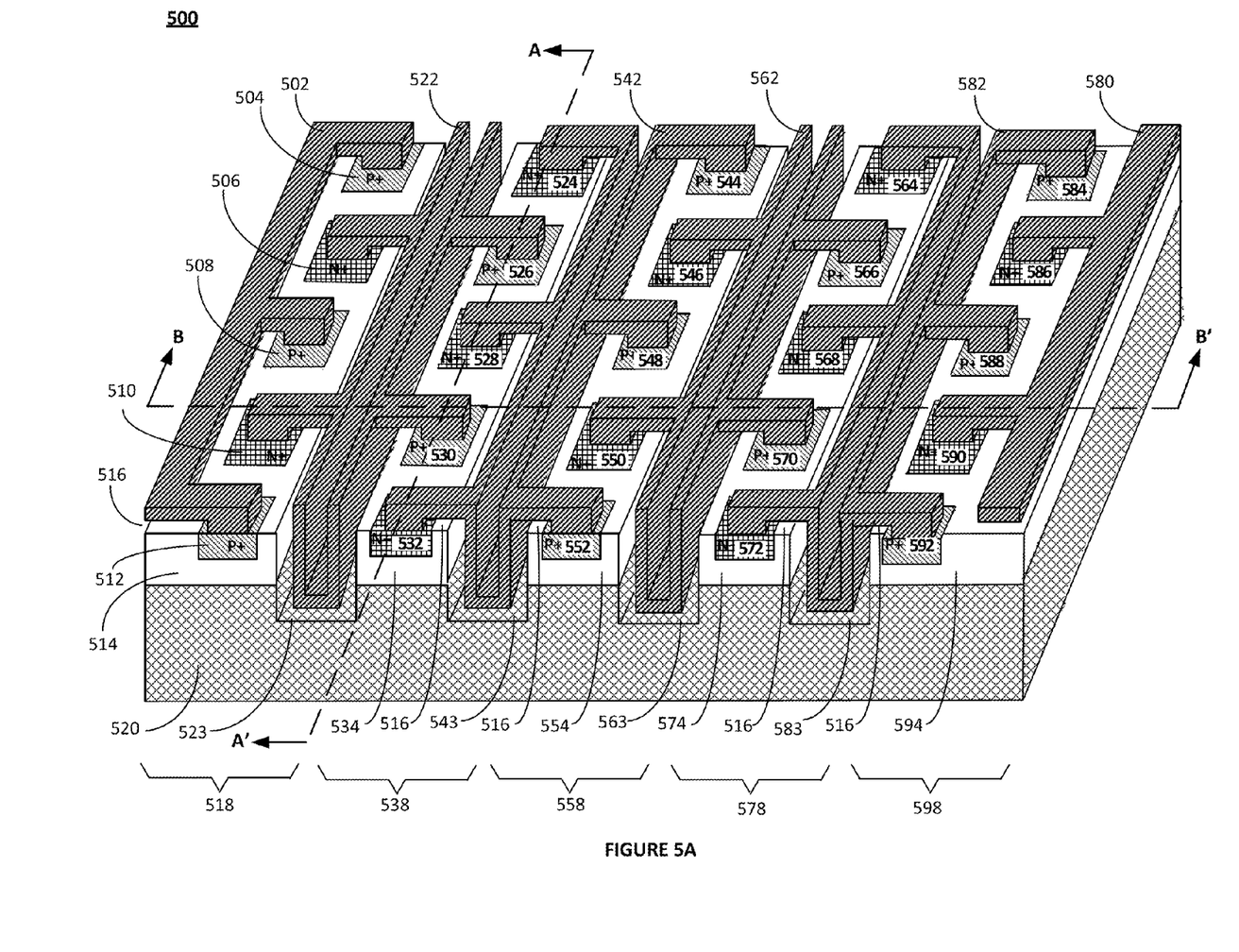
Figure 5B:
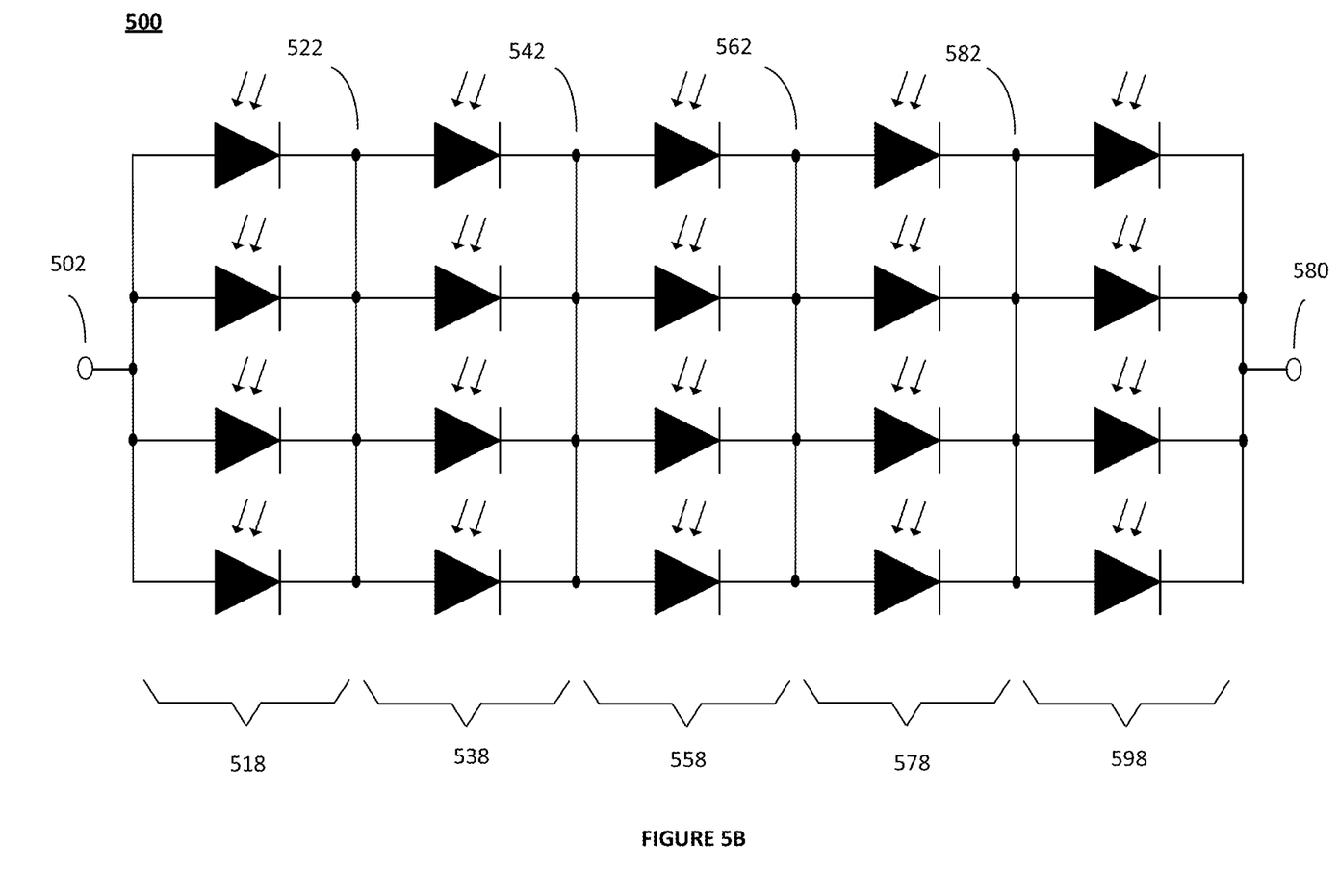
Figure 5C:
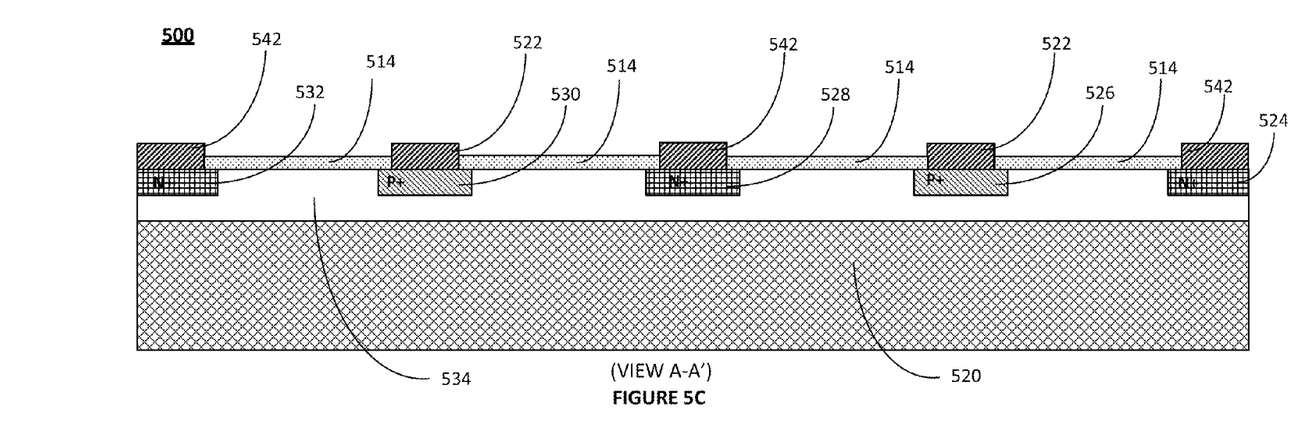
Figure 5D:
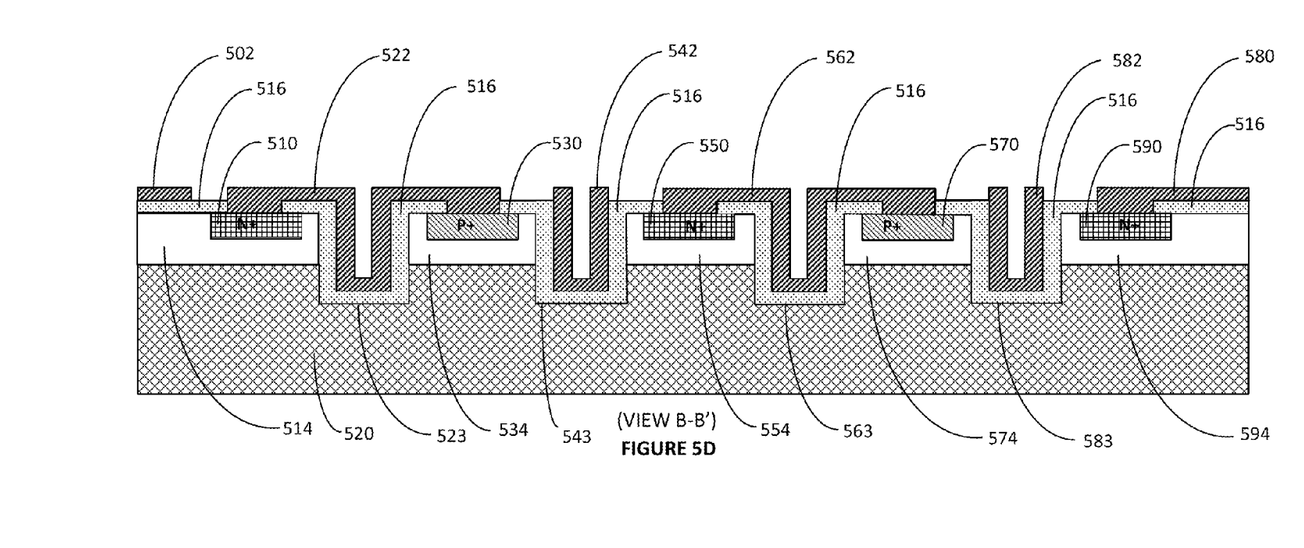

FIG. 5 depicts an array of multiple diode devices 500 formed by alternating interdigitated N+ collection junctions 506, 510, 526, 530, 546, 550, 566, 570, 586, 590 and P+ ohmic contact regions 504, 508, 512, 524, 528, 532, 544, 548, 552, 564, 568, 572, 584, 588, 592 employing a lateral collection method according to the present invention shown in a perspective view in FIG. 5A, in longitudinal sectional view A-A' in FIG. 5C and in a lateral sectional view B-B' in FIG. 5D. FIG. 5B depicts symbolic electrical representations 518, 538, 558, 578, 598 of the device configuration shown in FIG. 5A that comprises five series-connected photovoltaic diodes cells 518, 538, 558, 578, 598.

FIGS. 5A through 5D depict similar diode configurations 518, 538, 558, 578, 598 where each diode configuration includes N+ collecting junctions and P+ ohmic contacts arranged in a parallel configuration. FIGS. 5A through 5D illustrate a series connection of 5 photovoltaic diodes with multiple contacts. Considering the first device 518 (and by analogy, the second 538, third 558, fourth 578 and fifth 598 devices), the first device is fabricated by forming alternating a first P+ ohmic contact region 504, a first N+ collection junction 506, a second P+ ohmic contact region 508, a second N+ collection junction 510 and a third P+ ohmic contact region 512 to a lightly doped P-type absorbing layer 514 employing a horizontal collection method. An anode metallization 502 of the first diode 518 is connected to the first P+ ohmic contact region 504, the second P+ ohmic contact region 508, and the third P+ ohmic contact region 512. A cathode metallization 522 of the first diode 518, which also serves as an anode metallization to the second diode 538, is connected to the first N+ collection junction 506 and the second N+ collection junction 510. Within each diode and between each succeeding diode, the connections between diffusions alternate between N+ collection junctions 506, 510, 524, 528, 532, 546, 550, 564, 568, 572, 586, 590 and P+ ohmic contact regions 504, 508, 512, 526, 530, 544, 548, 552, 566, 570, 584, 588, 592 and to the collection regions of the P-type absorbing layers 514, 534, 554, 574, 594. The electron and holes generated by photons absorbed in the P-type regions 514, 534, 554, 574, 594 travel laterally to the N+ collection junctions and P+ ohmic contact regions, respectively. The absorbing layers are thin and are grown on a substrate 520 of un-doped wide band gap material such as semi-insulating gallium arsenide or silicon. The absorbing layers may be P-type or N-type depending on the semiconductor material used.

The N+ collection junctions and the P+ ohmic contact regions may be formed by any appropriate technique and may be minimized in area because of the high lifetime in the absorbing layer particularly in the case of germanium as the absorbing material.

The surface protection and isolation in the trench areas is not shown in FIG. 5A for clarity. It is shown as layer 514, 516, or 612 in FIGS. 5C through 6F.

The dielectric layer has openings or vias to allow ohmic contact by a deposited metal film to the P+ ohmic contact regions and to the N+ collection junctions.

Lateral conduction takes place by diffusion of carriers between the ohmic contacts and along the interconnecting metal film. There is no LCL layer required.

Photon absorption occurs in the P-type layers 514, 534, 554, 574, 594 which may be doped somewhat higher in the vicinity of the substrate 520 to form a diffusion barrier to keep minority carriers from migrating into the substrate 520 where they may be lost by recombination. When photons are absorbed in the P-type layers 514, 534, 554, 574, 594, hole-electron pairs are generated in the P-type layer 514, 534, 554, 574, 594 and the holes migrate to the P+ ohmic contact regions and the electrons migrate to the N+ collection junctions. The diodes are defined by isolation trenches 523, 543, 563, 583 that are etched into the substrate material between the first diode 518 and second diode 538, between the second diode 538 and third diode 558, between the third diode 558 and the fourth diode 578, and between the fourth diode and the fifth diode 598. These trenches 523, 543, 563, 583 may be made narrow and refilled to present a smooth surface for ease of processing. Metallic interconnects 522, 542, 562, 582 are made between the cathode of the first diode 588 and the anode of the second diode 538, between the cathode of the second diode 538 and the anode of the third diode 538, between the cathode of the third diode 558 and the anode of the fourth diode 578, and between the cathode of the fourth diode 578 and the anode of the fifth diode 598. When illuminated, this results in a photovoltaic potential between the anode ohmic contact 502 of the first diode 518 and the cathode ohmic contact 580 of the fifth diode 598, with the five diodes being connected in series to provide additive voltage output. Note that the hole-electron migration is in a lateral direction.

The thermophotovoltaic array is configured to be illuminated in the near field through in the lower surface of the substrate 520. This provides the capability of having a smooth flat surface that is ideal for forming a near-field gap with a photon-emitting surface. The dielectric layer 514 and the metallization 502, 522, 542, 562, 582, 580 are selected for optimal back surface reflection for several reasons. It provides a second pass to absorb in band photons and recycles below band photons back to the emitter. The interdigitated junction regions may be formed by ion implantation, diffusion, or other appropriate techniques and alternate in a longitudinal and lateral direction.

FIG. 6 depicts steps of a typical fabrication process 600 for forming a multicell device according to the present invention. The example describes a germanium absorbing layer grown on a semi insulating gallium arsenide substrate.

Figure 6A:
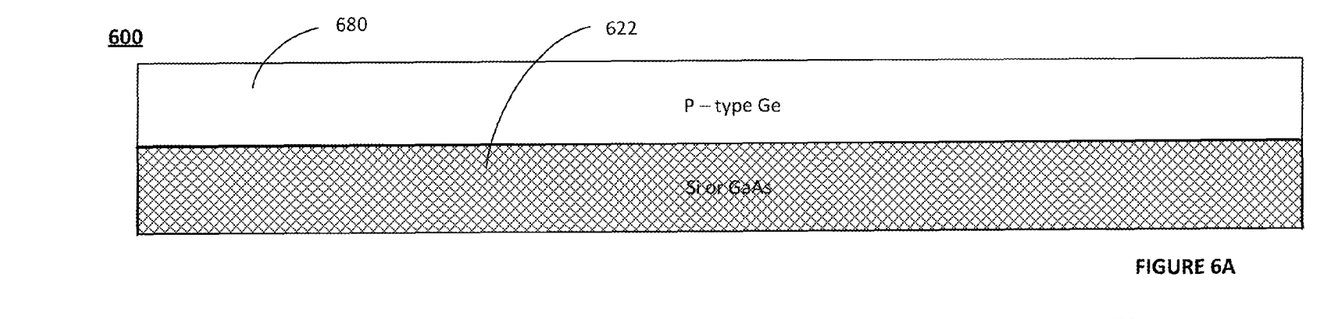
Figure 6B:
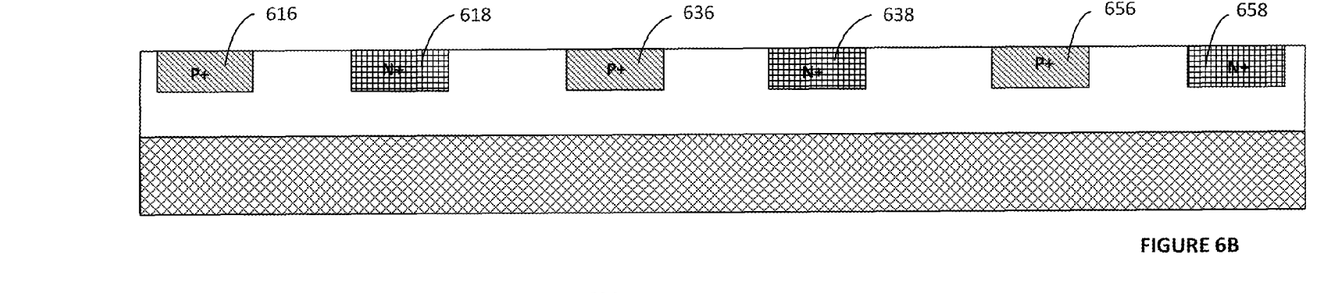
Figure 6C:
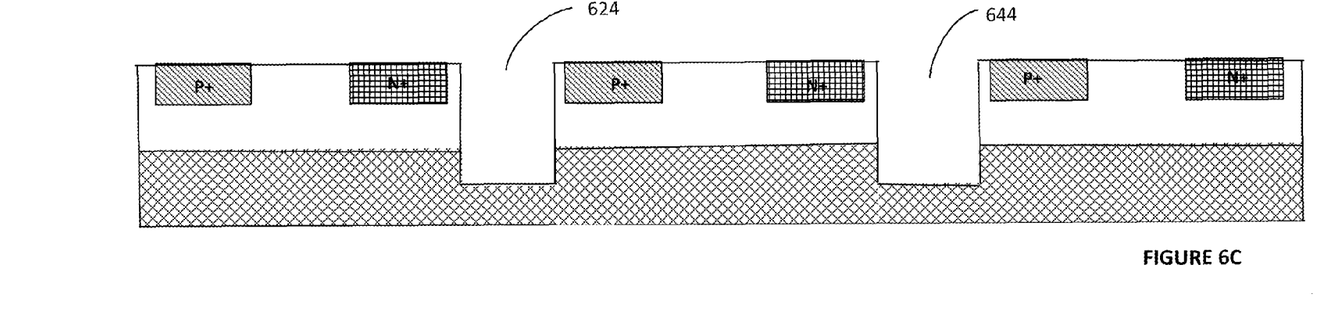
Figure 6D:
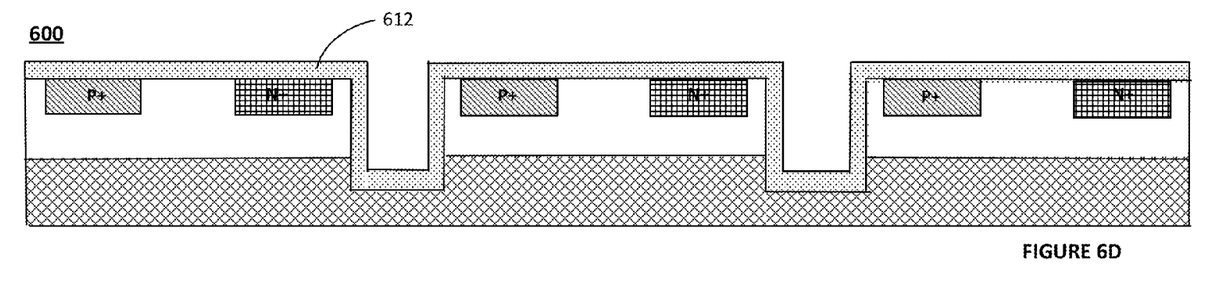
Figure 6E:
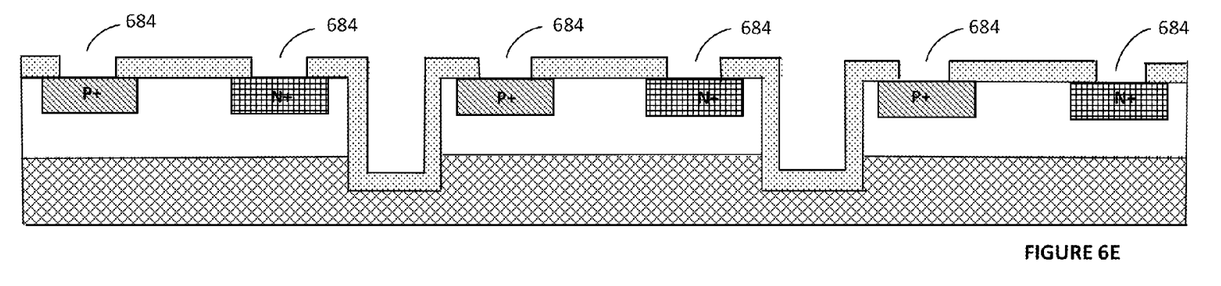
Figure 6F:
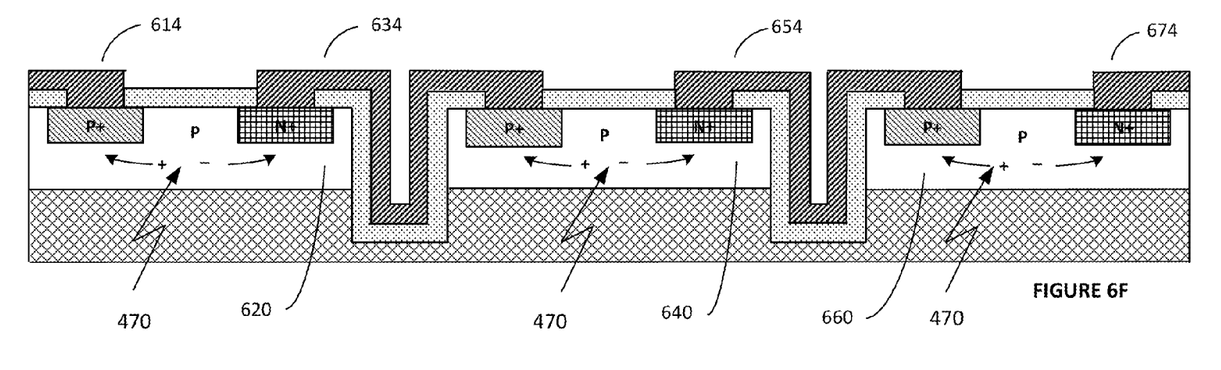

The description relies on the disclosed configuration shown in FIG. 4A and described herein. These process steps may be easily expanded to fabricate smaller devices as well as larger scale arrays. FIG. 6A depicts a thin layer of lightly doped P type germanium 680 epitaxially grown on a substrate 622 of undoped gallium arsenide. The germanium layer adjacent to the substrate 622 has a thin moderately doped P layer which forms a back surface reflector, a diffusion barrier which keeps minority carriers from diffusion into the substrate where they will be lost due to recombination. FIG. 6B depicts P+ regions 616, 636, 656 and N+ regions 618, 638, 658 formed in the P-layer 680 by ion implantation. The P-layer regions between the P+ and N+ regions provide a lateral collection region for electron-hole pairs generated by absorbing incident photons. FIG. 6C depicts trenches cuts 624, 644 through the P type germanium layer down to the substrate 622 providing isolation between the diodes formed by the P+ and N+ regions and the P type germanium layer. FIG. 6D depicts a dielectric layer 612 deposited over the surface. FIG. 6E depicts vias 684 that are cut to expose contact areas to the P+ and N+ regions. FIG. 6F depicts ohmic contacts 614, 634, 654, 674 formed by metallization patterns for interconnection purposes. FIG. 6F represents the device shown in FIG. 4A.

The invention claimed is:
1. A multicell photovoltaic monolithic semiconductor device for generating electrical energy, comprising:
an undoped substrate common to all cells of the multicell photovoltaic monolithic semiconductor device, the substrate having a first surface for receiving infrared and near-infrared photon energy from an emitter heat source in a near field and a second surface opposite the first surface forming an interface with a plurality of thin lateral collection region layers;

the plurality of thin lateral collection region layers for generating electron-hole pairs from absorbed photon energy from the near field emitting surface;

N+ collection junctions and P+ ohmic contact regions formed in a surface of each of the plurality of thin lateral collection region layers opposite the substrate, the N+ collection junctions for collecting electrons and the P+ ohmic contact regions for collecting holes from the electron-hole pairs traveling laterally in the plurality of thin lateral collection region layers;

isolation cuts between individual cells of the multicell photovoltaic device, the individual cells formed by isolating adjacent P+ ohmic contact regions and N+ collection junctions within each of the plurality of thin lateral collection region layers;

dielectric layers formed on the surface of each of the plurality of thin lateral collection region layers opposite the substrate and on surfaces of the isolation cuts; and metal interconnections and vias in the dielectric material for interconnecting N+ collection junctions and P+ ohmic contact regions within and between individual cells in an array for forming the multicell photovoltaic monolithic semiconductor device.

2. The multicell photovoltaic monolithic semiconductor device of claim 1, wherein each individual cell of the multicell photovoltaic monolithic semiconductor device includes one or more diode configurations, each diode configuration includes an N+ collection junction and a P+ ohmic contact region.

3. The multicell photovoltaic monolithic semiconductor device of claim 1, wherein the first surface of the substrate is separated from the emitting heat source by less than one micron.

4. The multicell photovoltaic monolithic semiconductor device of claim 1, wherein the dielectric layers and metal interconnections comprise a back surface reflector for recycling below band photons back to the emitter heat source.

5. The multicell photovoltaic monolithic semiconductor device of claim 1, wherein the dielectric layers and metal interconnections comprise a back surface reflector for providing a second pass for reflected in-band photons to be absorbed in the plurality of thin lateral collection region layers.

6. The multicell photovoltaic monolithic semiconductor device of claim 1, wherein multiple cells may be fabricated and interconnected as a monolithic large scale array.

7. The multicell photovoltaic monolithic semiconductor device of claim 1, further comprising isolation of the plurality of thin lateral collection region layers from a heterojunction of the substrate by a thin layer of medium doped material in the vicinity of the interface of the plurality of thin lateral collection region layers and the second surface of the substrate to form a diffusion barrier to keep minority carriers from migrating into the substrate from the plurality of thin lateral collection region layers where they would be lost by recombination.

8. The multicell photovoltaic monolithic semiconductor device of claim 1, wherein lateral conduction takes place by diffusion of carriers between ohmic contacts and along interconnecting metallization layers, with no lateral conduction layers buried within the device.

9. The multicell photovoltaic monolithic semiconductor device of claim 1, wherein electron-hole pairs created in the plurality of thin lateral collection region layers by impinging photons travel laterally to collection junctions and ohmic contact regions.

10. The multicell photovoltaic monolithic semiconductor device of claim 1, wherein the substrate first surface provides a smooth flat surface for forming a near-field gap with a photon-emitting surface.

11. The multicell photovoltaic monolithic semiconductor device of claim 1, wherein the plurality of thin lateral collection region layers are germanium semiconductor materials, wherein material bandgaps provide a good match for converting energy from a low temperature heat source.

12. The multicell photovoltaic monolithic semiconductor device of claim 1, wherein the undoped substrate is selected from the group consisting of semi-insulating gallium arsenide, silicon, and indium phosphide.

13. The multicell photovoltaic monolithic semiconductor device of claim 1, wherein the plurality of thin lateral collection region layers is selected from the group consisting of N-type and P-type material.

14. The multicell photovoltaic monolithic semiconductor device of claim 1, wherein the plurality of thin lateral collection region layers is selected from the group consisting of germanium, GaSb, GaInSb, GaInAs, GaInAsSb and InGaAs.

15. The multicell photovoltaic monolithic semiconductor device of claim 1, wherein the photovoltaic device is a thermophotovoltaic device.

16. The multicell photovoltaic monolithic semiconductor device of claim 1, wherein the substrate first surface receives infrared and near-infrared photon energy from an emitter heat source in a far field.

17. A multicell photovoltaic monolithic semiconductor device for generating electrical energy, comprising:

an undoped substrate common to all cells of the multicell photovoltaic monolithic semiconductor device;

a plurality of thin lateral collection region layers for generating electron-hole pairs from absorbed photon energy;

N+ collection junctions and P+ ohmic contact regions formed in a surface of each of the plurality of thin lateral collection region layers, the N+ collection junctions for collecting electrons and the P+ ohmic contact regions for collecting holes from the electron-hole pairs traveling laterally in the plurality of thin lateral collection region layers;

isolation cuts between individual cells of the multicell photovoltaic device, the individual cells formed by isolating adjacent P+ ohmic contact regions and N+ collection junctions within each of the plurality of thin lateral collection region layers;

dielectric layers formed on the surface of each of the plurality of thin lateral collection region layers on surfaces of the isolation cuts; and metal interconnections and vias in the dielectric material for interconnecting N+ collection junctions and P+ ohmic contact regions within and between individual cells in an array for forming the multicell photovoltaic monolithic semiconductor device.

* * * * *